United States Patent
Khwa et al.

(10) Patent No.: US 9,478,288 B1
(45) Date of Patent: Oct. 25, 2016

(54) METHOD FOR PROGRAMMING MEMORY DEVICE AND ASSOCIATED MEMORY DEVICE

(71) Applicant: MACRONIX INTERNATIONAL CO., LTD., Hsinchu (TW)

(72) Inventors: Win-San Khwa, Taipei (TW);
Tzu-Hsiang Su, Hsinchu County (TW);
Chao-I Wu, Hsinchu (TW);
Hsiang-Pang Li, Zhubei (TW);
Yu-Ming Chang, Pingtung County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/687,998

(22) Filed: Apr. 16, 2015

(51) Int. Cl.
*G11C 16/04* (2006.01)
*G11C 13/00* (2006.01)

(52) U.S. Cl.
CPC ....... *G11C 13/0069* (2013.01); *G11C 13/0004* (2013.01); *G11C 13/0026* (2013.01); *G11C 13/0028* (2013.01); *G11C 13/0064* (2013.01)

(58) Field of Classification Search
USPC .......................... 365/185.22, 185.12, 185.11
See application file for complete search history.

(56) References Cited

U.S. PATENT DOCUMENTS

| | | | |
|---|---|---|---|
| 2004/0240269 A1* | 12/2004 | Cernea | G11C 8/08 365/185.12 |
| 2008/0137409 A1* | 6/2008 | Nakamura | G11C 16/0483 365/185.2 |
| 2009/0310421 A1* | 12/2009 | Cernea | G11C 11/5628 365/185.19 |

* cited by examiner

Primary Examiner — Vu Le
(74) Attorney, Agent, or Firm — McClure, Qualey & Rodack, LLP

(57) ABSTRACT

A method for programming a memory device comprises the following steps: performing an interleaving programming, including: programming a first memory cell during a first time interval and correspondingly verifying the first memory cell during a second time interval; programming a second memory cell during a third time interval and correspondingly verifying the second memory cell during a fourth time interval between the first and second time intervals; and inserting at least one dummy cycle between the first and second time intervals to ensure that a resistance change per unit of time of the first memory cell is less than a threshold.

20 Claims, 8 Drawing Sheets

METHOD FOR PROGRAMMING MEMORY DEVICE AND ASSOCIATED MEMORY DEVICE

TECHNICAL FIELD

The disclosure relates in general to a memory operating method and an associated memory device, and more particularly to a method for programming a memory device and an associated memory device.

BACKGROUND

Typically, memory programming can be divided into two categories: single cell program and page program. The former relies on iterative program-verify cycle to ensure that the cell metric is within the target range. The latter programs the whole page of memory cells before the verifications.

However, for a phase change memory (PCM) that suffers resistance drift effect, its cell resistance may vary with time. This resistance variation may cause the verified cell resistance to be an inaccurate representation of the final resistance in single cell program or page program and widens the final resistance distribution.

Therefore, there is a need to provide a memory programming technique that is capable of alleviating the resistance drift effects among the memory cells and improving the data reliability.

SUMMARY

The disclosure is directed to a method for programming a memory device and an associated memory device.

According to one embodiment, a method for programming a memory device including a plurality of memory cells is provided. The method comprises the following steps: performing an interleaving programming, including: programming a first memory cell of the memory cells during a first time interval and correspondingly verifying the first memory cell during a second time interval; programming a second memory cell of the memory cells during a third time interval and correspondingly verifying the second memory cell during a fourth time interval between the first and second time intervals; and inserting at least one dummy cycle between the first and second time intervals to ensure that a resistance change per unit of time of the first memory cell is less than a threshold.

According to another embodiment, a method device is provided. The method device comprises a memory array, a row decoder, a column decoder and a controller. The memory array comprises plurality of memory cells. The row decoder connects the memory cells via a plurality of word lines. The column decoder connects the memory cells MC via the bit lines. The controller performs an interleaving programming to cause the row decoder and the column decoder to: program a first memory cell of the memory cells during a first time interval and correspondingly verify the first memory cell during a second time interval; program a second memory cell of the memory cells during a third time interval and correspondingly verify the second memory cell during a fourth time interval between the first and second time intervals; and insert at least one dummy cycle between the first and second time intervals to ensure that a resistance change per unit of time of the first memory cell is less than a threshold.

Figure 1:
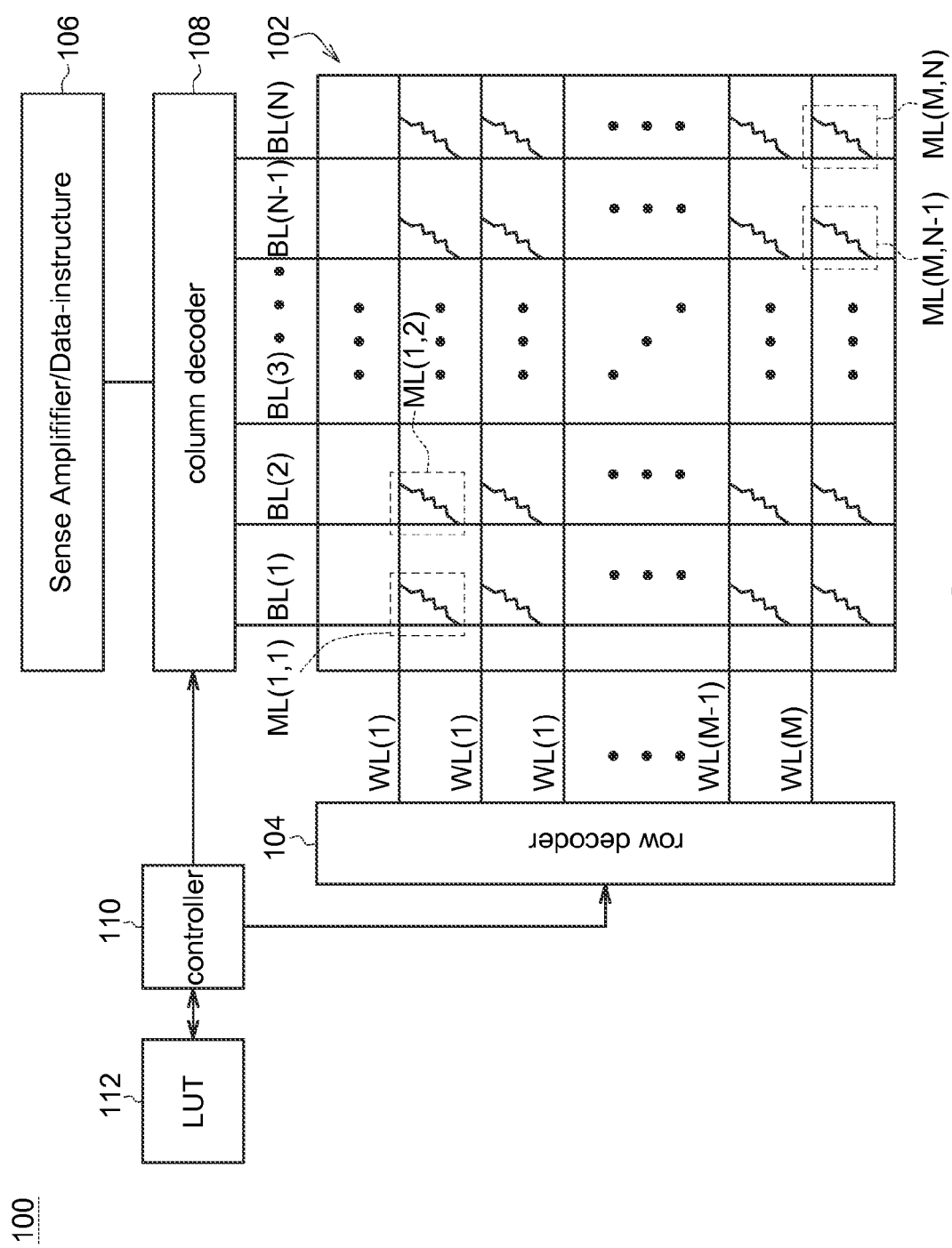
FIG. 1 illustrates a memory device according to one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a memory device 100 according to one embodiment of the present invention. The memory device 100 comprises a memory array 102 comprising a plurality of memory cells MC(1,1), MC(1,2) . . . , and MC(M,N) (referred to herein as memory cells MC), a row decoder 104, a sense amplifier/data-in structure 106, a column decoder 108 and a controller 110. The memory cells can be phase change memory (PCM) cells or other types of cells. The row decoder 104 connects the memory cells MC via a plurality of word lines WL(1)-WL(M) (referred to herein as global bit lines WL). In response to received address information, the row decoder 104 may select one of M rows of memory cells MC via the word lines WL. The sense amplifier/data-in structure 106 may detect data stored in the memory cells MC via bit lines BL(1)-BL(N) (referred to herein as global bit lines BL). For example, the sense amplifier/data-in structure 106 includes current sources for the read, set, and reset modes, and is coupled to the column decoder 108 via the bit lines BL. The column decoder 108 connects the memory cells MC via the bit lines BL. In response to the received address information, the column decoder 108 may select one of N columns of memory cells MC via the bit lines BL. The controller 110 may control the row decoder 104 and column decoder 108 to perform program actions, verify actions, delay actions, or other actions. In one embodiment, the memory device 100 may further comprise a look-up table (LUT) 112 for recording a plurality of parameters related to the resistance characteristics of the memory cells MC. The parameters stored in the LUT 112 can be provided to the controller 110 for optimal programming policy.

Figure 2:
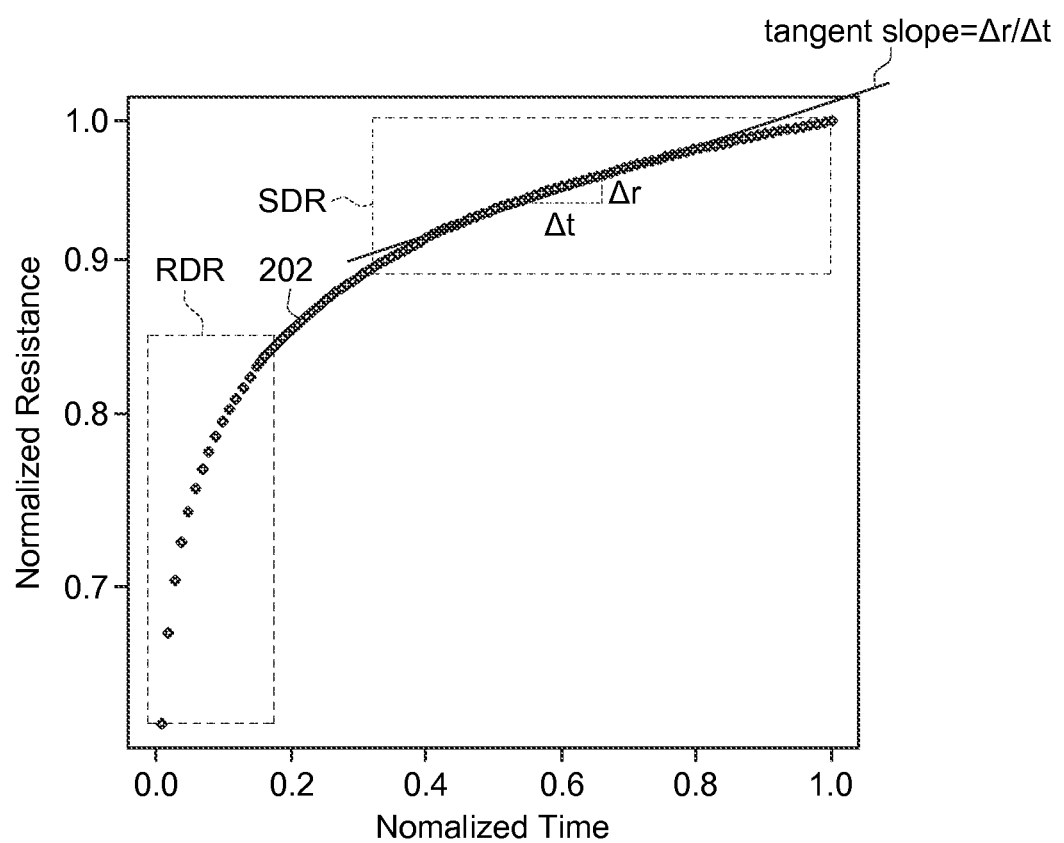
FIG. 2 illustrates an example of a normalized drift resistance characteristic of a memory cell.
Figure 3:
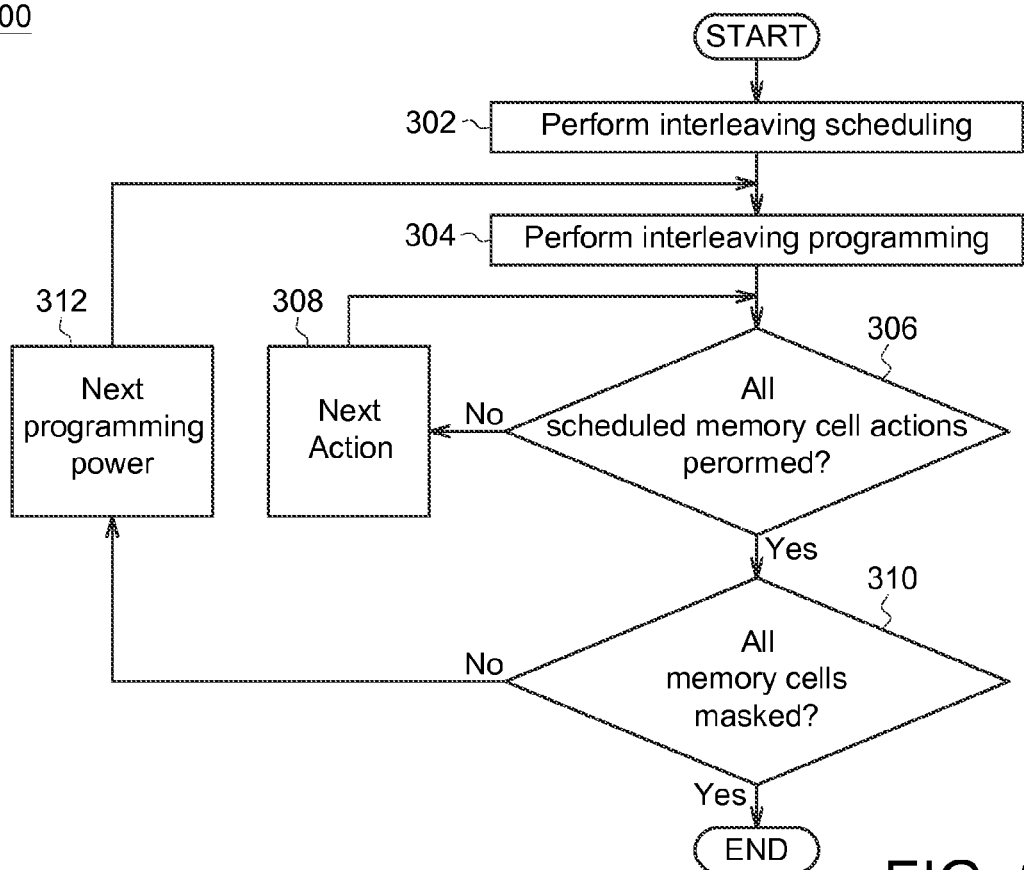
FIG. 3 illustrates a flowchart for memory programming according to one embodiment of the present invention.

Refer to FIGS. 2 and 3. FIG. 2 illustrates an example of a normalized resistance characteristic of a memory cell MC. FIG. 3 illustrates a flowchart 300 for memory programming according to one embodiment of the present invention.

Generally, the resistance of a memory cell MC may drift with time and can be modeled by the following exponential equation:

$$R(t) = R_0 \left(\frac{t}{t_0}\right)^{\gamma} \tag{eq1}$$

where the term $R_0$ represents an initial resistance, the term $t_0$ represents a reference time and the term $\gamma$ represents a resistance drift coefficient.

The normalized resistance characteristic curve 202 shown in FIG. 2 can be obtained by dividing the equation eq1 by $R_0$ with $\gamma=0.1$ and $t_0=1$. In general, the resistance characteristic curve of a memory cell MC can be divided into two regions: a rapid drift region RDR and a slow drift region SDR. In one embodiment, the rapid drift region RDR and the slow drift region SDR can be distinguished by the tangent slope ($\Delta r/\Delta t$) of the resistance characteristic curve. For example, for a curve segment whose tangent slope is larger than a threshold, it can be regarded as being within the rapid drift region RDR; for a curve segment whose tangent slope is less than a threshold, it can be regarded as being within the slow drift region SDR. Accordingly, the amount of resistance change ($\Delta r$) per unit of time ($\Delta t$) of a memory cell MC in the rapid drift region RDR is larger than that in the slow drift region SDR. As shown in FIG. 2, the curve 202 rises rapidly in the rapid drift region RDR while slowly in the slow drift region SDR. Since data stored in a memory cell MC is determined by its resistance value, data reliability may decrease when a memory cell MC is operated in its rapid drift region RDR.

To address the resistance drift issue, the controller 110 may perform interleaving scheduling to avoid the rapid drift region RDR (step 302). For example, based on the parameter stored in the LUT 112, the controller 110 may adaptively re-arrange the action orders of Incremental Step Pulse Programming (ISPP) to ensure enough time elapse between each program action and its corresponding verify action. In one embodiment, the policy of the interleaving scheduling may consider the following conditions:

1. Ensure enough time elapse between each program action and its corresponding verify to avoid the rapid drift region RDR; and/or
2. Minimize/equalize the time elapse variation among the memory cells MC; and
3. Insert dummy cycles (delay actions) when necessary to satisfy the above one or both conditions.

At step 304, the controller 110 may perform interleaving programming to control the row decoder 104 and the column decoder 108 to execute the scheduled program/verify/delay actions. For example, the controller 110 may control the row decoder 104 and the column decoder 108 to:

program the memory cell MC(1,1) shown in FIG. 1 during a first time interval and correspondingly verify the memory cell MC(1,1) during a second time interval;

program the memory cell MC(1,2) during a third time interval and correspondingly verify the second memory cell during a fourth time interval between the first and second time intervals; and insert at least one dummy cycle between the first and second time intervals to ensure that the resistance change per unit of time of the memory cell MC(1,1) is less than a threshold, that is, to ensure that the memory cell MC(1,1) is read in its slow drift region SDR or non-rapid drift region.

At step 306, the controller 110 may check whether all scheduled memory cell actions (e.g., program/verify/delay actions) are performed. If no, step 308 is performed, and the next action is executed.

After all scheduled memory cell actions are performed, the controller 110 may check whether all memory cells MC (or a target group of the memory cells MC, e.g., memory cells MC(1,1) to MC(1,n), where n is an integer less than N) are masked (step 310). If there is still remaining unmasked memory cell MC, step 312 is performed, and the next programming power is applied to the unmasked memory cells MC according to ISPP scheme.

Figure 4:
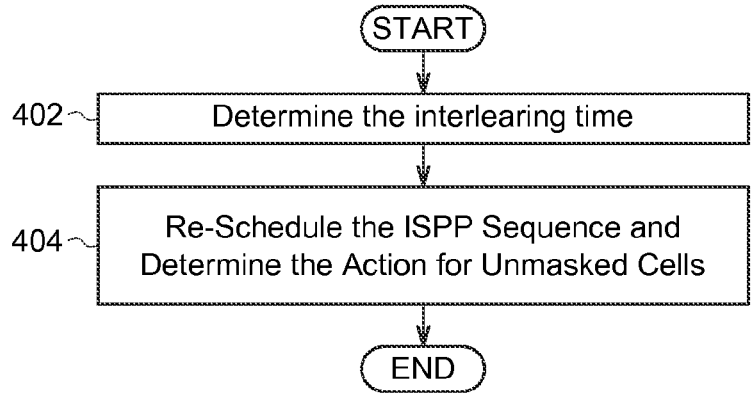
FIG. 4 illustrates a flowchart of the interleaving scheduling according to one embodiment of the present invention.

FIG. 4 illustrates a flowchart 400 of the interleaving scheduling according to one embodiment of the present invention. At step 402, the controller 402 may determine an interleaving time for each target memory cell MC base on the abovementioned interleaving scheduling policy to avoid reading the target memory cells MC in their rapid drift regions RDR.

The interleaving time may indicate a time elapse between a program action and its corresponding verify action. In one embodiment, the interleaving time can be obtained by searching the LUT 112 which records a plurality of parameters associated with the resistance characteristics of the memory cells MC. The parameters may comprise, for example, at least one of temperature, program time, verify time, target interleaving time and delay time. In another embodiment, the interleaving time can be obtained by performing one or more testing accesses on the memory cells MC. For example, the controller 110 may read the memory cells MC to obtain resultant reading data, and modeling the resistance characteristics of the memory cells MC base on the resultant reading data to determine the interleaving time.

At step 404, the controller 110 may re-schedule the ISPP sequence base on the interleaving time and determine the action for the unmasked memory cell(s). For example, the controller 110 may determine how many dummy cycles, program actions, or verify actions should be inserted into the time elapse between a program action and its corresponding verify action according to the interleaving time. Based on the re-scheduled ISPP sequence, the actions for the unmasked memory cell(s) can then be determined.

Figure 5:
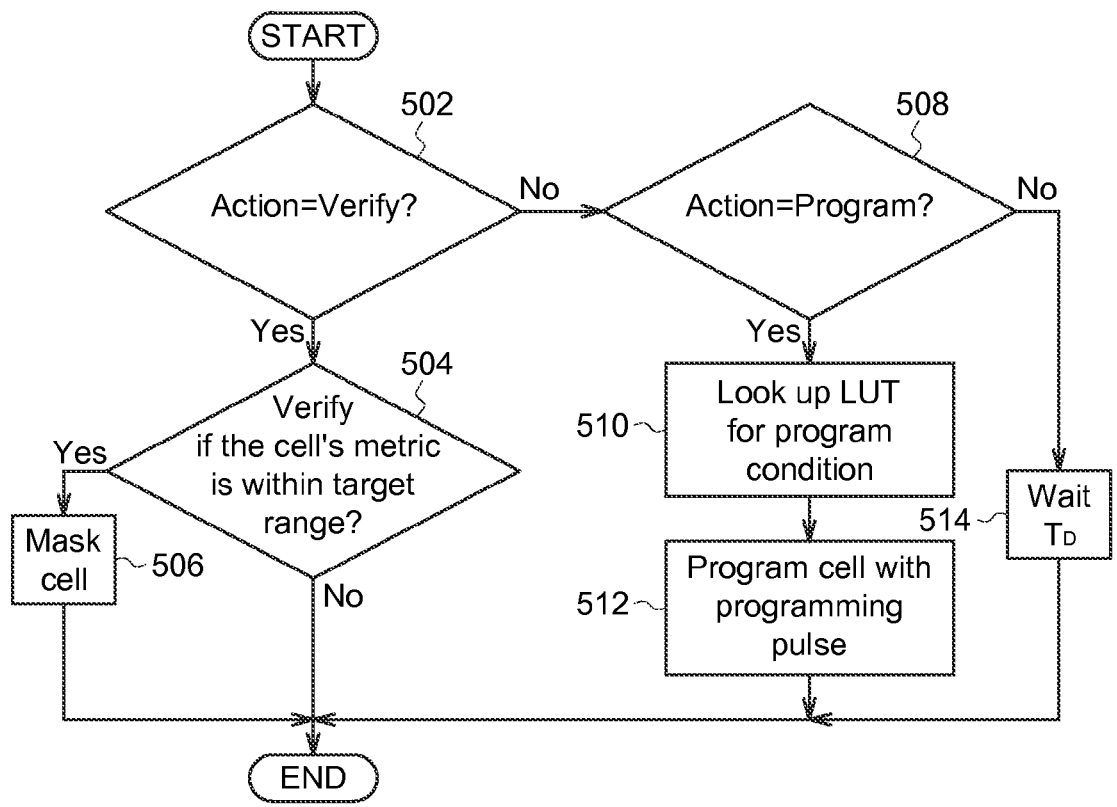
FIG. 5 illustrates a flowchart of the interleaving programming according to one embodiment of the present invention.

FIG. 5 illustrates a flowchart 500 of the interleaving programming according to one embodiment of the present invention. As mentioned earlier, the interleaving programming includes executing the program/verify/delay actions of the re-scheduled ISPP sequence. As shown in FIG. 5, the controller 110 first determines whether the current action for a target memory cell MC is verification or not (step 502). If yes, the controller 110 may verify the target memory cell MC. For example, the controller 110 may verify whether the cell metric (e.g., voltage, current, or resistance) of the target memory cell MC is within a target resistance range or not (step 504). If yes, the controller 110 then masks the target memory cell MC from the following actions (step 506). In contrast, if the determination result of step 502 is negative, then the controller 110 checks whether the current action is programming or not (step 508). If yes, the controller 110 may program the target memory cell MC. For example, the controller 110 may look up the LUT 112 for a program condition (step 510) and program the target memory cell MC with a programming pulse (step 512). If not, the controller 110 may wait (delay) a dummy cycle $T_D$ to satisfy the interleaving scheduling policy (step 514).

Figure 6:
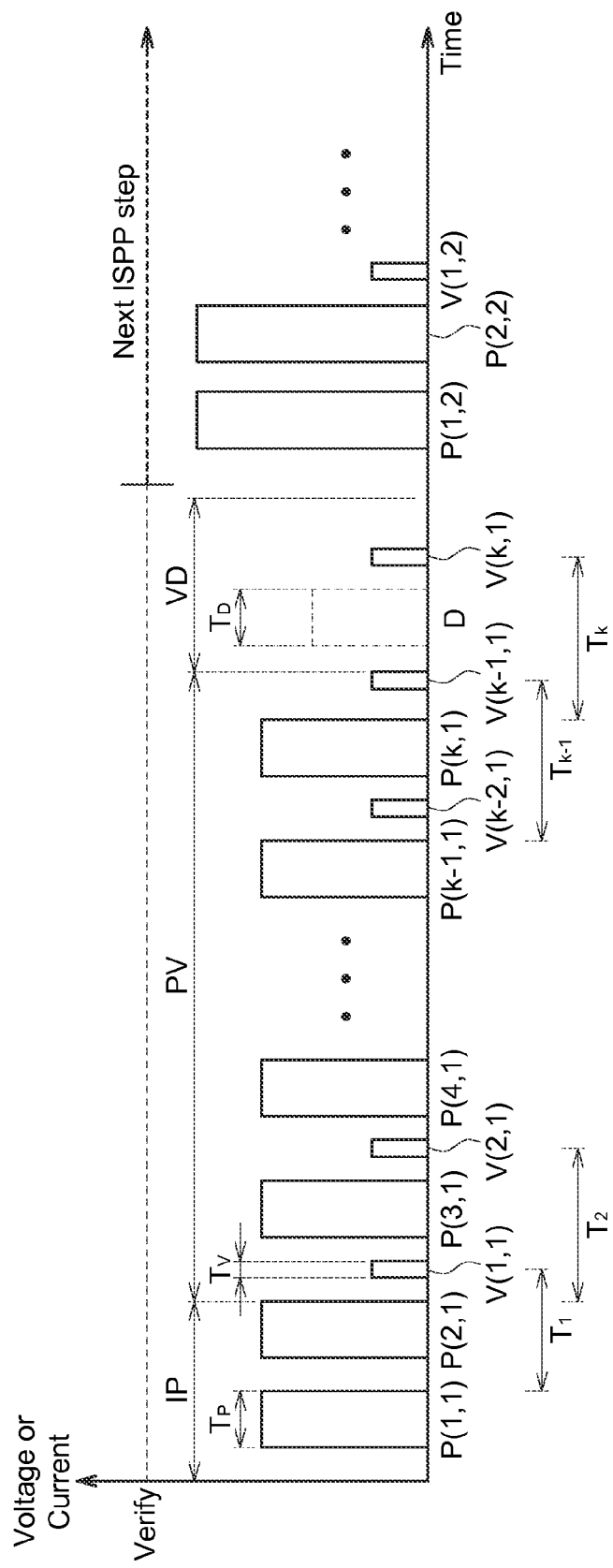
FIG. 6 illustrates an example of a re-scheduled ISPP sequence according to one embodiment of the present invention.

FIG. 6 illustrates an example of a re-scheduled ISPP sequence according to one embodiment of the present invention. In FIG. 6, "X(n,m)" means a program/verify (X=P or V) action for the $n^{th}$ memory cell of a target group of memory cells at the $m^{th}$ ISPP step; "D" means the dummy cycle. Assume that the target group of memory cells includes k memory cells (e.g., MC(1,1) to MC(1,k), where k is an integer less than or equal to N). P(1,1) means the program action for the memory cell MC(1,1) at the first ISPP step; P(2,1) means the program action for the memory cell MC(1,2) at the first ISPP step; P(k−1,1) means the program action for the memory cell MC(1,k−1) at the first ISPP step; P(k,1) means the program action for the memory cell MC(1,k) at the first ISPP step, etc. Similarly, P(1,2) means the program action for the memory cell MC(1,1) at the second ISPP step; P(2,2) means the program action for the memory cell MC(1,2) at the second ISPP step; P(k−1,2) means the program action for the memory cell MC(1,k−1) at the second ISPP step; P(k,2) means the program action for the memory cell MC(1,k) at the second ISPP step, etc.

In the embodiment, each program action has its corresponding verify action. As shown in FIG. 6, V(1,1), which corresponds to the program action P(1,1), means the verify action for the memory cell MC(1,1) at the first ISPP step; V(2,1), which corresponds to the program action P(2,1), means the verify action for the memory cell MC(1,2) at the first ISPP step; V(k−1,1), which corresponds to the program action P(k−1,1), means the verify action for the memory cell MC(1,k−1) at the first ISPP step; V(k,1), which corresponds to the program action P(k,1), means the verify action for the memory cell MC(1,k) at the first ISPP step, etc.

In the example of FIG. 6, the program time for each program action is $T_P$, the verify time for each verify action is $T_V$ and the delay time for each dummy cycle D is $T_D$. If $T_P \gg T_V$ and $T_P = T_D$, and the interleaving time for the target memory cells (e.g., MC(1,1) to MC(1,k)) is equal to the program time $T_P$, the respective time elapses $T_1$ to $T_k$ between each program action and its corresponding verify action can be expressed by:

$$T_1 = T_P$$

$$T_2 = T_P + T_V \approx T_P$$

.

.

.

$$T_{k-1} = T_P + T_V \approx T_P$$

$$T_k = T_V + T_D \approx T_P \quad (eq2)$$

As can be seen from equations eq2, the time elapses $T_1$ to $T_k$ are approximately equal to the program time ($1*T_P$). For the same ISPP step, each program action and its corresponding verify action can be regarded as being separated by a program action, except that the last program action and its corresponding verify action is separated by a dummy cycle D. As shown in FIG. 6, the program action P(1,1) and its corresponding verify action V(1,1) is separated by the program action P(2,1); the program action P(2,1) and its corresponding verify action V(2,1) is separated by the program action P(3,1); the program action P(k−1,1) and its corresponding verify action V(k−1,1) is separated by the program action P(k,1); the program action P(k,1), which is the last program action at the first ISPP step, and its corresponding verify action V(k,1) is separated by a dummy cycle D.

Figure 7:
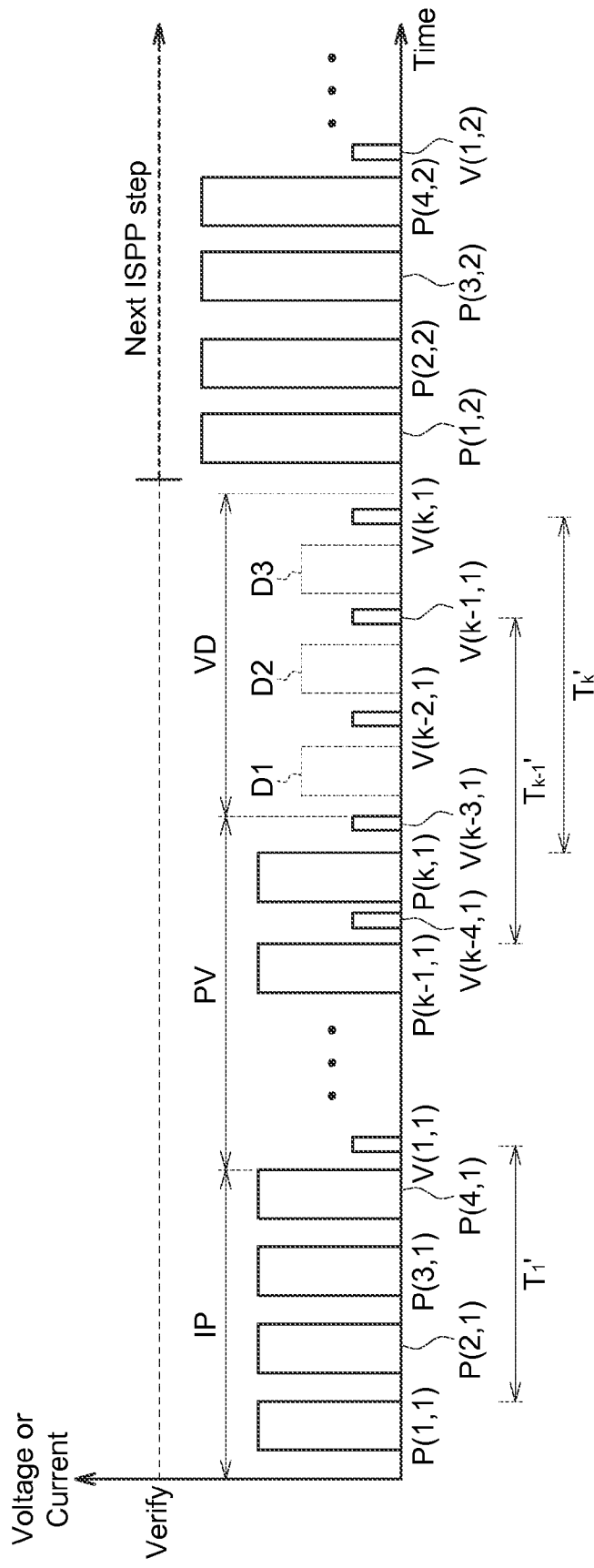
FIG. 7 illustrates another example of a re-scheduled ISPP sequence according to one embodiment of the present invention.

FIG. 7 illustrates another example of a re-scheduled ISPP sequence according to one embodiment of the present invention. The main difference between the examples of FIGS. 6 and 7 is that in FIG. 7 the interleaving time for the target memory cells MC(1,1) to MC(1,k) is $3*T_P$. If $T_P \gg T_V$ and $T_P = T_D$, the respective time elapses $T_1'$ to $T_k'$ between each program action and its corresponding verify action can be expressed by:

$$T_1' = 3T_P$$

$$T_2' = 3T_P + T_V \approx 3T_P$$

.

.

.

$$T_{k-1}' = T_P + 2T_D + T_V \approx T_P + 2T_D \approx 3T_P$$

$$T_k' = 3T_D + 3T_V \approx 3T_D \approx 3T_P \quad (eq3)$$

As can be seen from equations eq3, the time elapses $T_1'$ to $T_k'$ are approximately equalized to the interleaving time ($3*T_P$). For the same ISPP step, each program action and its corresponding verify action can be regarded as being separated by three program actions, except that the last program action (e.g., P(k,1)) and its corresponding verify action (i.e., V(k,1)) is separated by three dummy cycles D, as shown in FIG. 7.

It is understood that the present invention is not limited to the above examples. In another embodiment, the respective interleaving time for the target memory cells can be chosen according to practical needs and are unequal.

Based on the scheduling rules of FIGS. 6 and 7, the re-scheduled ISPP sequence may comprise an initial phase IP, a program & verify phase PV and a verify & dummy phase VD. In the initial phase IP, a portion of the target memory cells are sequentially programmed without performing verification. That is, program actions are performed sequentially without performing any verify actions in this phase IP. The number of program actions in the initial phase is determined by the interleaving time. As shown in FIG. 6, two (1+programming pulses in the interleaving time) memory cells MC(1,1) and MC(1,2) are sequentially programmed (P(1,1) and P(2,1)) in the initial phase IP. Similarly, as shown in FIG. 7, four (1+programming pulses in the interleaving time) memory cells MC(1,1) to MC(1,4) are sequentially programmed (P(1,1) to P(4,1)) in the initial phase IP.

The program & verify phase PV can be regard as a mixture of program and verify actions. In one embodiment, the program and verify actions are performed alternately in this phase PV. Taking FIG. 6 as an example, the verify action V(1,1), the program action P(3,1), the verify action (2,1), the program action (4,1), . . . , and the verify action V(k−1,1) are performed alternately in the program & verify phase PV.

The verify & dummy phase VD can be regard as a mixture of verify and delay actions. As shown in FIG. 6, in the verify & dummy phase VD, the verify action V(k,1) follows shortly after the dummy cycle (delay action) D. In FIG. 7, the dummy cycle D1, the verify action V(k−2,1), the dummy cycle D2, the verify action V(k−1,1), the dummy cycle D3 and the verify action V(k,1) are performed alternately in this phase VD.

Figure 8A:
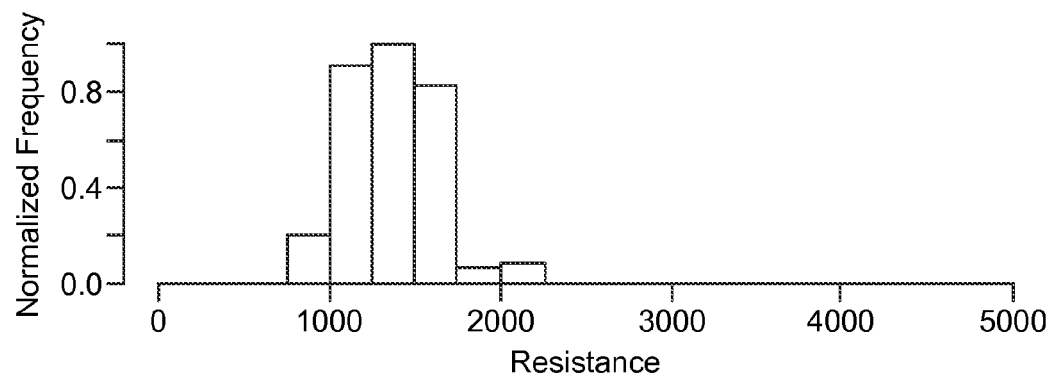
FIG. 8A illustrates an exemplary resistance drift distribution based on the proposed interleaving programming technique.
Figure 8B:
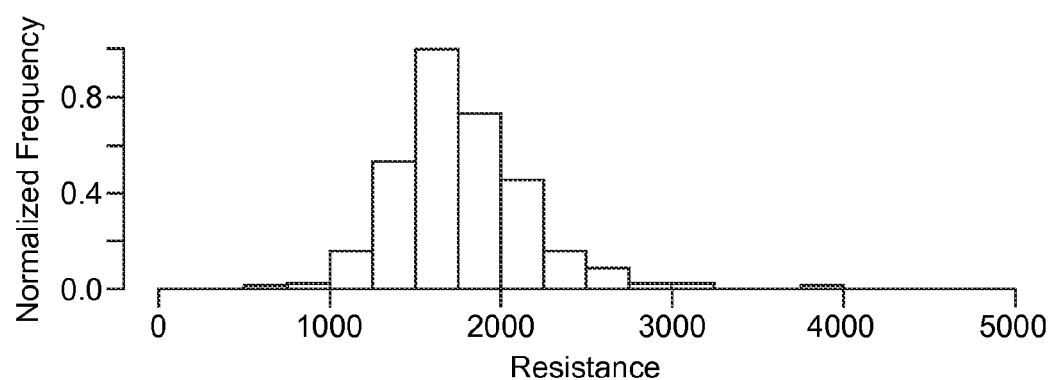
FIG. 8B illustrates an exemplary resistance drift distribution based on an original programming technique.

Refer to FIGS. 8A and 8B. FIG. 8A illustrates an exemplary resistance drift distribution based on the proposed interleaving programming technique. FIG. 8B illustrates an exemplary resistance drift distribution based on an original programming technique that each verify action follows immediately after its corresponding program action.

For comparison, the resistance drift distributions of FIGS. 8A and 8B are obtained after the same period of time (e.g., 100 seconds) and for the same number of memory cells (e.g., 256 memory cells). In FIG. 8A, the interleaving time is approximately equal to $16*T_P$ (about 1.6 μs, where $T_P=100$ ns) and the initial resistance ($R_O$) is equal to 1 MΩ. As can be seen from these figures, the interleaving programming technique enables tighter resistance drift distributions.

Figure 9:
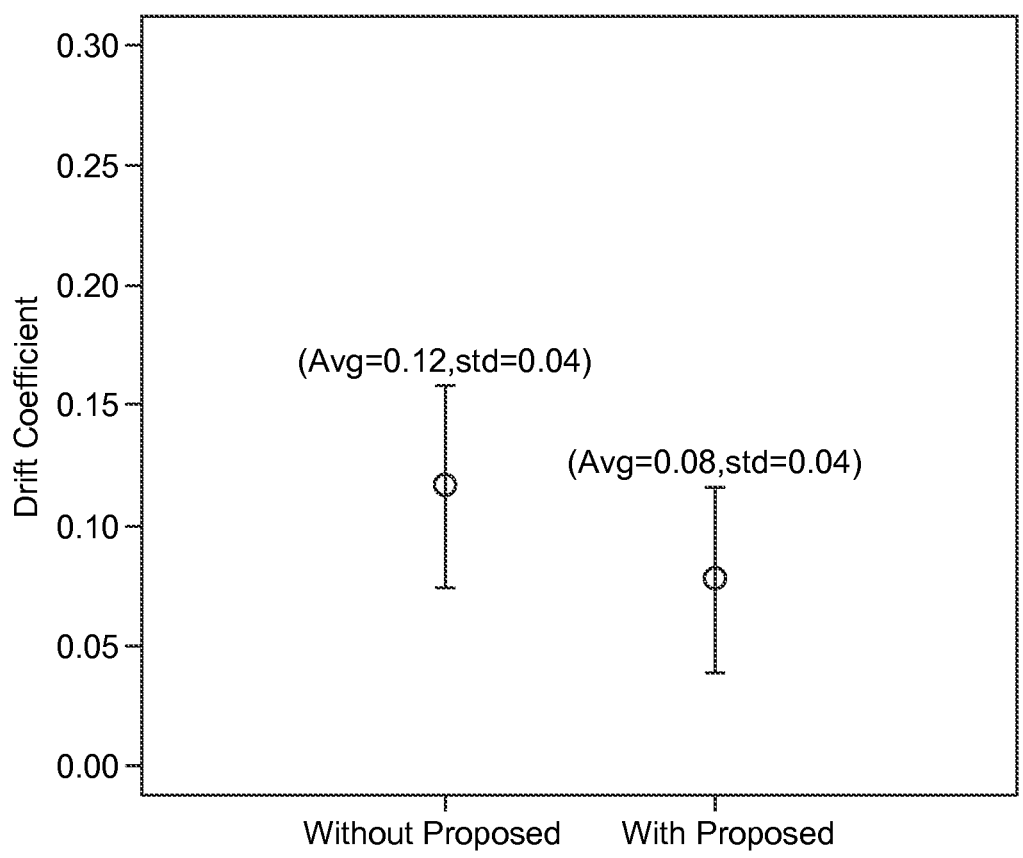
FIG. 9 illustrates the calculated drift coefficients from the examples of FIGS. 8A and 8B.

FIG. 9 illustrates the calculated drift coefficients (γ) from the examples of FIGS. 8A and 8B. As shown in FIG. 9, the proposed interleaving programming technique can provide a 33% reduction in average drift coefficient and accordingly alleviate the resistance drift effect.

In summary, the embodiments of the present invention can avoid reading the cell resistance in the rapid drift region by inserting actions between program actions and their corresponding verify action. The actions can be dummy cycles, interleaving program actions, interleaving verify actions, or other actions. Based on the interleaving scheduling policy, the orders of an ISPP sequence can be re-scheduled with an appropriate interleaving time to obtain tighter resistance drift distributions. Therefore, resistance drift effects among the memory cells can be alleviated and the reliability of data reading can be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for programming a memory device including a plurality of memory cells, comprising:
    performing an interleaving programming, including:
        programming a first memory cell of the memory cells during a first time interval and correspondingly verifying the first memory cell during a second time interval;
        programming a second memory cell of the memory cells during a third time interval and correspondingly verifying the second memory cell during a fourth time interval between the first and second time intervals; and
        inserting at least one dummy cycle between the first and second time intervals to ensure that a resistance change per unit of time of the first memory cell is less than a threshold.

2. The method according to claim 1, further comprising:
    performing an interleaving scheduling, including:
        determining an interleaving time for each of the memory cells according to a resistance characteristic of each of the memory cells; and
        determining actions for the memory cells according to the interleaving time, wherein the actions comprise a program action, a verify action and a delay action corresponding to the at least one dummy cycle.

3. The method according to claim 2, wherein the interleaving time indicates a time elapse between each program action and its corresponding verify action.

4. The method according to claim 2, wherein the number of the at least one dummy cycle is determined by the interleaving time.

5. The method according to claim 2, wherein said determining the interleaving time further comprises:
    searching a look-up table (LUT) to obtain the interleaving time;
    wherein the LUT records a plurality of parameters related to the resistance characteristics of the memory cells.

6. The method according to claim 5, wherein the parameters comprises at least one of temperature, program time, verify time, target interleaving time and delay time.

7. The method according to claim 2, wherein said determining the interleaving time further comprises:
    reading the memory cells to obtain resultant reading data; and
    modeling the resistance characteristic of each of the memory cells base on the resultant reading data so as to determine the interleaving time.

8. The method according to claim 2, wherein the interleaving scheduling further comprises:
    equalizing the respective interleaving time for the memory cells.

9. The method according to claim 2, wherein the interleaving programming further comprises
    an initial phase, including:
        performing a plurality of first program actions sequentially without performing any verify actions;
    a program and verify phase, including:
        performing a plurality of second program actions and a plurality of first verify actions alternately; and
    a verify and dummy phase, including:
        performing one or more second verify actions and one or more first delay actions alternately.

10. The method according to claim 9, wherein the number of the first program actions in the initial phase is determined by the interleaving time.

11. A method device, comprising:
    a memory array comprising plurality of memory cells;
    a row decoder, connecting the memory cells via a plurality of word lines;
    a column decoder, connecting the memory cells MC via the bit lines; and
    a controller, performing an interleaving programming to cause the row decoder and the column decoder to:
        program a first memory cell of the memory cells during a first time interval and correspondingly verify the first memory cell during a second time interval;
        program a second memory cell of the memory cells during a third time interval and correspondingly verify the second memory cell during a fourth time interval between the first and second time intervals; and
        insert at least one dummy cycle between the first and second time intervals to ensure that a resistance change per unit of time of the first memory cell is less than a threshold.

12. The method device according to claim 11, wherein the controller performs an interleaving scheduling to:
    determine an interleaving time for each of the memory cells according to a resistance characteristic of each of the memory cells; and
    determine actions for the memory cells according to the interleaving time, wherein the actions comprise a program action, a verify action and a delay action corresponding to the at least one dummy cycle.

13. The method device according to claim 12, wherein the interleaving time indicates a time elapse between each program action and its corresponding verify action.

14. The method device according to claim 12, wherein the number of the at least one dummy cycle is determined by the interleaving time.

15. The method device according to claim 12, further comprising:
a look-up table (LUT), recording a plurality of parameters related to the resistance characteristics of the memory cells.

16. The method device according to claim 15, wherein the parameters comprises at least one of temperature, program time, verify time, target interleaving time and delay time.

17. The method device according to claim 12, wherein the controller controls the row decoder and the column decoder to reading the memory cells to obtain resultant reading data, and models the resistance characteristic of each of the memory cells base on the resultant reading data so as to determine the interleaving time.

18. The method device according to claim 12, wherein the respective interleaving time for the memory cells are equalized.

19. The method device according to claim 12, wherein the interleaving programming further comprises:
an initial phase, including:
performing a plurality of first program actions sequentially without performing any verify actions;
a program and verify phase, including:
performing a plurality of second program actions and a plurality of first verify actions alternately; and
a verify and dummy phase, including:
performing one or more second verify actions and one or more first delay actions alternately.

20. The method device according to claim 11, wherein the number of the first program actions in the initial phase is determined by the interleaving time.

* * * * *